United States Patent
Song et al.

(10) Patent No.: US 11,056,622 B2
(45) Date of Patent: Jul. 6, 2021

(54) LIGHT SOURCE MODULE AND BACKLIGHT UNIT HAVING THE SAME

(71) Applicant: Seoul Semiconductor Co., Ltd., Ansan-si (KR)

(72) Inventors: Young Jun Song, Ansan-si (KR); Da Hye Kim, Ansan-si (KR); Seoung Ho Jung, Ansan-si (KR)

(73) Assignee: Seoul Semiconductor Co., Ltd.

( * ) Notice: Subject to any disclaimer, the term of this patent is extended or adjusted under 35 U.S.C. 154(b) by 63 days.

(21) Appl. No.: 16/256,712

(22) Filed: Jan. 24, 2019

(65) Prior Publication Data

US 2019/0172985 A1    Jun. 6, 2019

Related U.S. Application Data

(63) Continuation of application No. 14/274,293, filed on May 9, 2014, now abandoned.

(30) Foreign Application Priority Data

May 9, 2013    (KR) .................. 10-2013-0052531
Aug. 26, 2013  (KR) .................. 10-2013-0101025

(51) Int. Cl.
   *H01L 33/50*    (2010.01)
   *F21V 8/00*     (2006.01)
   (Continued)

(52) U.S. Cl.
   CPC .......... *H01L 33/505* (2013.01); *G02B 6/0073* (2013.01); *H01L 33/60* (2013.01); *G02F 1/133614* (2021.01)

(58) Field of Classification Search
   CPC ...... H01L 33/505; H01L 33/60; G02B 6/0073
   See application file for complete search history.

(56) References Cited

U.S. PATENT DOCUMENTS 5,027,258 A      6/1991   Schoniger et al.
5,962,971 A  *  10/1999   Chen ................... H01L 33/507
                                                 257/E33.059
(Continued)

FOREIGN PATENT DOCUMENTS

JP    2003-110153    4/2003
JP    2004-134699    4/2004
(Continued)

OTHER PUBLICATIONS

Notice of Final Rejection dated Aug. 11, 2020 in Korean Patent Application No. 10-2013-0101025.
(Continued)

*Primary Examiner* — Thomas M Sember
(74) *Attorney, Agent, or Firm* — H.C. Park & Associates, PLC (57) ABSTRACT

A backlight unit including a light guide plate, a first light source and a second light source adjacent to the light guide plate, each of the light sources including a light emitting diode chip including a substrate and a semiconductor stack disposed on the substrate, a wavelength conversion layer covering the light emitting diode chip, and a plurality of reflectors disposed on at least two opposing side surfaces of the light emitting diode chip, in which at least a portion of the wavelength conversion layer of the first light source facing the second light source is exposed by the reflectors.

18 Claims, 6 Drawing Sheets

(51) Int. Cl.
*H01L 33/60* (2010.01)
*G02F 1/1335* (2006.01)

(56) References Cited

U.S. PATENT DOCUMENTS

| | | | |
|---|---|---|---|
| 6,642,652 | B2 | 11/2003 | Collins, III et al. |
| 8,104,907 | B2 | 1/2012 | Shchekin et al. |
| 8,410,509 | B2 | 4/2013 | Kim |
| 8,541,801 | B2 | 9/2013 | Kim et al. |
| 8,742,433 | B2* | 6/2014 | Ajiki .................. H01L 25/0753 257/88 |
| 9,857,526 | B2 | 1/2018 | Song |
| 2004/0119409 | A1* | 6/2004 | Kubota .................. G09F 13/22 313/512 |
| 2004/0207999 | A1 | 10/2004 | Suehiro |
| 2006/0249742 | A1* | 11/2006 | Noh .................. G02F 1/133603 257/98 |
| 2007/0187710 | A1 | 8/2007 | Steen et al. |
| 2008/0284308 | A1 | 11/2008 | Pang |
| 2010/0118530 | A1* | 5/2010 | Nagai .................. H01L 25/0753 362/235 |
| 2011/0006329 | A1 | 1/2011 | Fujita et al. |
| 2012/0132946 | A1 | 5/2012 | Park |
| 2012/0138995 | A1 | 6/2012 | Hwang |
| 2012/0243256 | A1* | 9/2012 | Lee .................. F21K 9/64 362/609 |
| 2013/0050612 | A1* | 2/2013 | Hur .................. G02B 6/009 349/62 |
| 2015/0270442 | A1* | 9/2015 | Chae .................. H01L 33/24 257/88 |

FOREIGN PATENT DOCUMENTS

| | | |
|---|---|---|
| JP | 2006-332638 | 12/2006 |
| KR | 10-2006-0095271 | 8/2006 |
| KR | 10-2006-0130394 | 12/2006 |
| KR | 10-2007-0103882 | 10/2007 |
| KR | 10-2010-0080423 | 7/2010 |
| KR | 10-2012-0050282 | 5/2012 |
| KR | 10-2012-0066972 | 6/2012 |
| KR | 10-2012-0078234 | 7/2012 |
| KR | 10-2013-0030178 | 3/2013 |

OTHER PUBLICATIONS

Korean Office Action dated Aug. 16, 2019, issued in Korean Patent Application 10-2013-0101025.
Non-Final Office Action dated Sep. 21, 2015 in U.S. Appl. No. 14/274,293.
Final Office Action dated Mar. 16, 2016 in U.S. Appl. No. 14/274,293.
Non-Final Office Action dated Jun. 30, 2016 in U.S. Appl. No. 14/274,293.
Final Office Action dated Jan. 12, 2017 in U.S. Appl. No. 14/274,293.
Non-Final Office Action dated Jun. 23, 2017 in U.S. Appl. No. 14/274,293.
Final Office Action dated Dec. 19, 2017 in U.S. Appl. No. 14/274,293.
Non-Final Office Action dated Mar. 12, 2018 in U.S. Appl. No. 14/274,293.
Notice of Allowance dated Oct. 25, 2018 in U.S. Appl. No. 14/274,293.

* cited by examiner

LIGHT SOURCE MODULE AND BACKLIGHT UNIT HAVING THE SAME

CROSS-REFERENCES TO RELATED APPLICATIONS

This application is a continuation of U.S. patent application Ser. No. 14/274,293, filed on May 9, 2014, and claims priority from and the benefit of Korean Patent Application Nos. 10-2013-0052531, filed on May 9, 2013 and 10-2013-0101025, filed on Aug. 26, 2013, which are hereby incorporated by reference for all purposes as if fully set forth herein.

BACKGROUND

Field

The present invention relates to a light source module and, more particularly, to a light source module which realizes a slim structure and exhibits excellent luminous efficiency, and a backlight unit including the same.

Discussion of the Background

Generally, a backlight unit is broadly used as a light source for supplying light to a liquid crystal display or as a surface-lighting device.

Backlight units of liquid crystal displays are classified into a direct type or an edge type according to locations of light emitting devices.

The direct type backlight unit has been mainly developed so as to keep pace with enlargement of liquid crystal displays to a size of 20 inches or more, and includes a plurality of light sources placed under a lower surface of a diffusive plate such that light can be directly emitted towards a front side of a liquid crystal display panel. Such a direct type backlight unit provides higher efficiency in use of light than the edge type backlight unit and thus is mainly applied to large liquid crystal displays that require high brightness.

The edge type backlight unit is generally applied to relatively small liquid crystal displays such as monitors of laptop computers and desktop computers and has various advantages such as good uniformity of light, long lifespan, easy thickness reduction, and the like.

As recently proposed in the art, a light emitting diode package advantageous in terms of low power consumption and thickness reduction for a slim structure is mounted on a substrate and disposed inside the edge type backlight unit.

However, although demand for thickness reduction to realize a slim structure of the edge type backlight unit including the light emitting diode package increases, packaging of a light emitting diode has a limitation in thickness reduction of the backlight unit and causes deterioration in heat dissipation, thereby making it difficult to employ a highly efficient light emitting diode chip.

SUMMARY

Exemplary embodiments of the present invention provide a light source module that provides high output and high efficiency and is advantageous in terms of thickness reduction.

Exemplary embodiments of the present invention provide a technology capable of reducing thickness of a backlight unit so as to realize a slim structure of the backlight unit.

Exemplary embodiments of the present invention provide a novel backlight unit capable of realizing a slim structure while permitting application of a highly efficient light emitting diode chip.

An exemplary embodiment of the present invention provides a light source module that includes: a circuit board; a light emitting diode chip mounted on the circuit board by flip-chip bonding or surface mount technology (SMT); a wavelength conversion layer placed on the light emitting diode chip; and a reflector covering an upper surface and at least one of side surfaces of the light emitting diode chip.

One side surface of the light emitting diode chip may be defined as an exit face, and the reflector may be placed on the wavelength conversion layer and cover the upper surface and one side surface of the wavelength conversion layer.

The upper surface of the light emitting diode chip may be defined as an exit face and the reflector may be placed on each of first and second side surfaces symmetrical to each other among the side surfaces of the light emitting diode chip.

One side surface of the light emitting diode chip may be defined as an exit face, the wavelength conversion layer may be placed on the exit face, and the reflector may cover an upper surface and the side surfaces of the light emitting diode chip excluding the exit face.

The reflector may directly contact the upper surface and the side surfaces of the light emitting diode chip.

The wavelength conversion layer may have a uniform thickness over the entirety thereof The upper surface of the light emitting diode chip may be defined as an exit face and the wavelength conversion layer may have a different thickness in a region covering the exit face than the thickness in other regions thereof.

One side surface of the light emitting diode chip may be defined as an exit face and the exit face may have a first convex-concave section having a convex-concave structure.

The wavelength conversion layer may have a convex-concave structure formed on an inner side thereof and corresponding to the first convex-concave section.

The wavelength conversion layer may include a second convex-concave section of a convex-concave structure formed on an outer side thereof.

Another exemplary embodiment of the present invention provides a backlight unit, which includes: a light guide plate having a flat structure over the entirety thereof; and a light source module placed at one side of the light guide plate, and including a circuit board, a light emitting diode chip mounted on the circuit board by flip-chip bonding or SMT, a wavelength conversion layer placed on the light emitting diode chip and a reflector covering an upper surface and at least one of side surfaces of the light emitting diode chip.

One surface of the circuit board may face one side surface of the light guide plate and the light emitting diode chip may be placed on the one surface of the circuit board.

An upper surface of the light emitting diode chip may be defined as an exit face and the reflector may be placed on first and second side surfaces symmetrical to each other among the side surfaces of the light emitting diode chip.

The wavelength conversion layer may have a uniform thickness over the entirety thereof.

The wavelength conversion layer may have a different thickness in a region covering the exit face than the thickness in other regions thereof.

The circuit board may be placed parallel to the light guide plate, the light emitting diode chip may be mounted on an upper surface of the circuit board, one side surface of the light emitting diode chip may be defined as an exit face, and the exit face may face one side surface of the light guide plate.

The reflector may be placed on the wavelength conversion layer and cover an upper surface and one side surface of the wavelength conversion layer.

The wavelength conversion layer may be placed on the exit face and the reflector may cover the upper surface and the side surfaces of the light emitting diode chip excluding the exit face.

The reflector may directly contact the upper surface and the side surfaces of the light emitting diode chip.

The exit face may include a first convex-concave section of a convex-concave structure, the wavelength conversion layer may include a convex-concave structure formed on an inner side thereof and corresponding to the first convex-concave section, and a second convex-concave section of a convex-concave structure formed on an outer side thereof.

An exemplary embodiment of the present invention provides a backlight unit including a light guide plate, a first light source and a second light source adjacent to the light guide plate, each of the light sources including a light emitting diode chip including a substrate and a semiconductor stack disposed on the substrate, a wavelength conversion layer covering the light emitting diode chip, and a plurality of reflectors disposed on at least two opposing side surfaces of the light emitting diode chip, in which at least a portion of the wavelength conversion layer of the first light source facing the second light source is exposed by the reflectors.

The first and second light sources may face each other through a surface on which the reflectors are not disposed, respectively.

The reflectors may include a first reflector and a second reflector, the first and second reflectors disposed on a substantially same plane as top and bottom surfaces of the light guide plate, respectively.

The first and second light sources may be disposed along a longitudinal direction of the substrate with a first interval therebetween.

The wavelength conversion layer may have a first surface facing a light entering surface of the light guide plate, and second side surfaces opposing each other, and the first surface and the second side surfaces may be exposed by the reflectors.

The wavelength conversion layer may include a first region disposed on an upper surface of the light emitting diode chip, and a second region disposed on side surfaces of the light emitting diode chip, and the first region and the second region may have the same thickness.

The wavelength conversion layer may include a first region disposed on an upper surface of the light emitting diode chip, and a second region disposed on side surfaces of the light emitting diode chip, and the first region may have a greater thickness than the second region.

One end of the reflector may face the light guide plate and the other end thereof may face the substrate.

A surface of the wavelength conversion layer interfacing the reflector may have a convex-concave pattern.

The reflector may include at least one of a resin coated with a reflective layer and a resin including a reflective material.

According to another exemplary embodiment of the present invention provides a backlight unit including a light guide plate having a substantially flat shape, at least one light source disposed adjacent to the light guide plate, the light source including a semiconductor stack, a wavelength conversion layer covering the semiconductor stack, and a reflective unit disposed on at least one side surfaces of the wavelength covering layer.

The reflective unit may include a first reflector disposed on a first surface of the light source, the first surface being disposed on a substantially the same plane as an upper surface of the light guide plate, and a second reflector disposed on a second surface of the light source, the second surface being disposed on a substantially the same plane as a bottom surface of the light guide plate.

The backlight unit may further include a printed circuit board (PCB), in which the light source is provided in plural on the PCB, and the reflective unit of each light source covers each side surface of the wavelength conversion layer that contacts the PCB and is substantially parallel to a longitudinal direction of the PCB.

A surface of the wavelength conversion layer interfacing the reflective unit may have a convex-concave pattern.

The reflective unit may include at least one of a resin coated with a reflective layer and a resin including a reflective material.

An upper surface of the reflective unit may be flush with an upper surface of the wavelength conversion layer.

A lower surface of the reflective unit is flush with a lower surface of the wavelength conversion layer.

The first and second reflectors are not disposed on a surface of the light source that faces an adjacent light source.

BRIEF DESCRIPTION OF THE DRAWINGS

FIG. 2a is a plan view of the light emitting diode chip shown in FIG. 1 and FIG. 2b is a sectional view of the light emitting diode chip taken along line I-I' of FIG. 2a;

DETAILED DESCRIPTION OF THE ILLUSTRATED EMBODIMENTS

Hereinafter, embodiments of the present invention will be described in detail with reference to the accompanying drawings. The following embodiments are provided as examples so as to fully convey the spirit of the present invention to those skilled in the art. Accordingly, the present invention is not limited to the embodiments disclosed herein and may also be implemented in different forms. In the drawings, width, length, thickness, and the like of components may be exaggerated for convenience. Throughout the present specification, like reference numerals denote like components having the same or similar functions. It will be apparent to those skilled in the art that modifications and changes of components falling within the scope of the present invention do not include definitive meanings and the spirit and scope of the invention should be defined only by the appended claims and their equivalents.

Next, exemplary embodiments of the present invention will be described in detail with reference to the accompanying drawings such that the present invention can be easily implemented by those skilled in the art.

Figure 1:
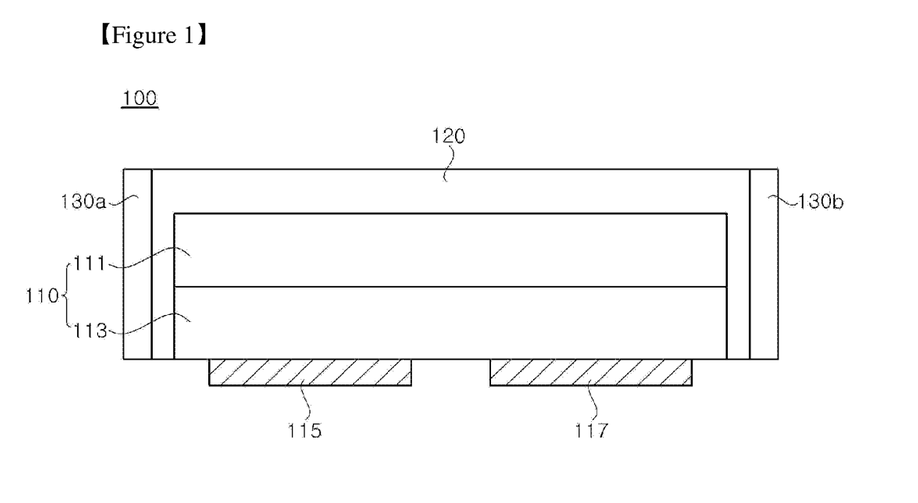
FIG. 1 is a schematic sectional view of a light emitting device in a backlight unit according to the present invention.

FIG. 1 is a schematic sectional view of a light emitting device in a backlight unit according to the present invention.

Referring to FIG. 1, a light emitting device 100 provided to the backlight unit according to the present invention includes a light emitting diode chip 110, a wavelength conversion layer 120, and a reflector.

The light emitting diode chip 110 includes a substrate 111 and a semiconductor stack 113, and may further include electrode pads 115, 117.

The light emitting diode chip 110 is a flip chip and the electrode pads 115, 117 are placed under a lower side of the chip.

The substrate 111 may be a growth substrate for growing a semiconductor layer, and may be, for example, a sapphire substrate or a gallium nitride substrate. Particularly, when the substrate 111 is a sapphire substrate, the semiconductor stack 113, the sapphire substrate 111 and the wavelength conversion layer 120 have indices of refraction in gradually descending order, thereby improving light extraction efficiency. In some embodiments, the substrate 111 may be omitted.

The semiconductor stack 113 is formed of a gallium nitride-based compound semiconductor and may emit ultraviolet (UV) or blue light.

The light emitting diode chip 110 is directly mounted on a circuit board (not shown). The light emitting diode chip 110 is directly mounted on the circuit board to be electrically connected to a printed circuit thereon by flip-chip bonding without using a bonding wire. According to the present invention, since the bonding wire is not used when bonding the light emitting diode chip 110 onto the circuit board, there is no need for a molding section for protection of the wire and for partial removal of the wavelength conversion layer 120 to expose a bonding pad. Accordingly, the use of the flip-chip type light emitting diode chip 110 can prevent color deviation or brightness spots and can simplify the process of fabricating the light emitting module, as compared with a light emitting diode chip using the bonding wire. Here, the light emitting diode chip 110 may be mounted on the circuit board by SMT (surface mount technology) as well as flip-chip bonding. SMT is a technology for directly mounting surface-mounted components (SMC) on the circuit board.

The wavelength conversion layer 120 covers the light emitting diode chip 110. As shown, the wavelength conversion layer 120 is formed to surround an upper surface and side surfaces of the light emitting diode chip 110. For example, a phosphor layer may be formed on the light emitting diode chip 110 to convert a wavelength of light emitted from the light emitting diode chip 110. The wavelength conversion layer 120 may be formed to a predetermined thickness on the light emitting diode chip 110 by coating so as to cover the upper surface and the side surfaces of the light emitting diode chip 110. Here, the wavelength conversion layer 120 may have a uniform thickness over the entirety thereof.

The wavelength conversion layer 120 may be formed in a structure in which a first wavelength conversion layer covering the side surfaces of the light emitting diode chip 110 has a smaller thickness than a second wavelength conversion layer covering the upper surface of the light emitting diode chip 110. Here, the light emitting diode chip 110 is a flip-chip type diode and emits more light in an upper direction thereof than in directions of both side surfaces thereof. Accordingly, the light emitting diode chip 110 according to the present invention may be designed such that the second wavelength conversion layer, through which a relatively large amount of light is emitted, has a greater thickness than the first wavelength conversion layer in order to obtain light in a desired wavelength band.

The reflector covers opposite sides of the wavelength conversion layer 120. The reflector includes a first reflector 130a placed on one side of the wavelength conversion layer 120 and a second reflector 130b placed on the other side of the wavelength conversion layer 120. As such, the first and second reflectors 130a, 130b are placed on the opposite sides of the wavelength conversion layer 120, which are symmetrical to each other. The first and second reflectors 130a, 130b reflect light, the wavelength of which has been converted by the wavelength conversion layer 120, towards the upper surface or other side surfaces of the light emitting device 100. That is, the first and second reflectors 130a, 130b serve to reflect light traveling to some side surfaces of the light emitting device 100 so as to collect the light on the upper surface or on the other side surfaces of the light emitting device 100.

The light emitting device 100 according to the present invention can realize various colors using the light, particularly, mixed light such as white light, emitted from the light emitting diode chip 110 and the wavelength conversion layer 120. In addition, the light emitting device 100 according to the present invention can maximize luminous efficiency by reflecting the light emitted towards some side surfaces of the light emitting device 100 through the first and second reflectors 130a, 130b to collect the light on the upper surface and desired side surfaces of the light emitting device 100.

Figure 2:
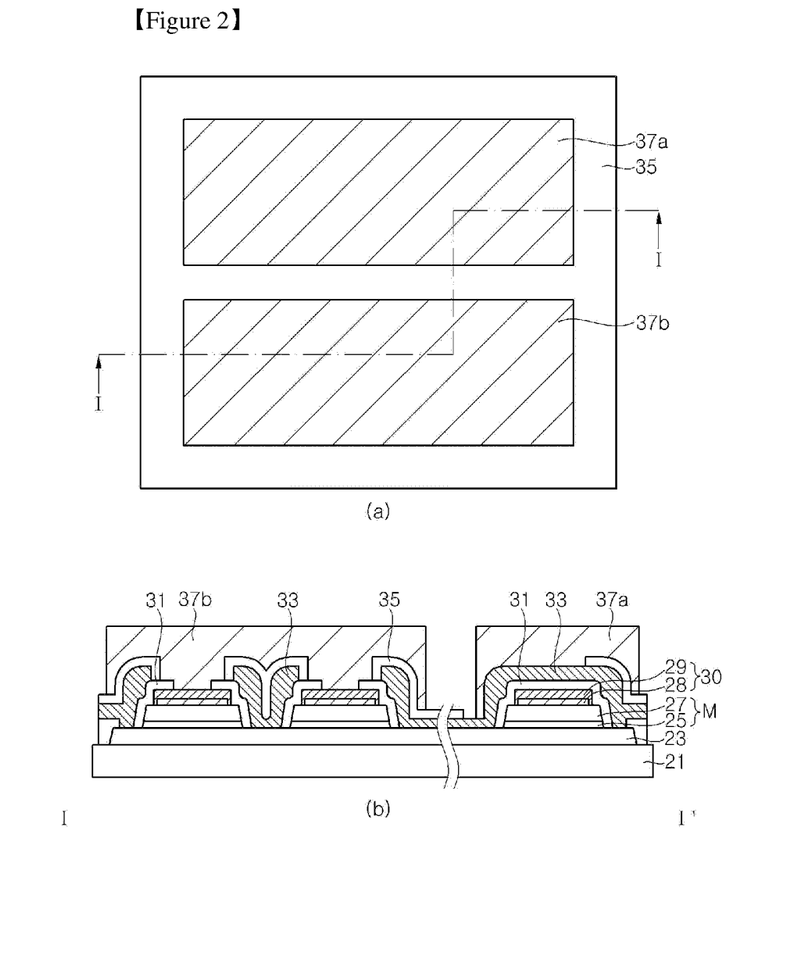

Referring to FIG. 2a and FIG. 2b, the structure of the light emitting diode chip 110 will be described in detail.

FIG. 2a is a plan view of the light emitting diode chip shown in FIG. 1 and FIG. 2b is a sectional view of the light emitting diode chip taken along line I-I' of FIG. 2a.

As shown in FIG. 2a and FIG. 2b, the light emitting diode chip according to the present invention includes a first conductive type semiconductor layer 23 formed on a growth substrate 21 and a plurality of mesas M formed on the first conductive type semiconductor layer 23 to be separated from each other. Each of the plural mesas M includes an active layer 25 and a second conductive type semiconductor layer 27. The active layer 25 is placed between the first conductive type semiconductor layer 23 and the second conductive type semiconductor layer 27. In addition, reflective electrodes 30 are placed on each of the plural mesas M.

As shown, the plural mesas M may have an elongated shape and extend parallel to each other in one direction. Such a shape simplifies formation of the plurality of mesas M having the same shape in a plurality of chip regions on the growth substrate 21.

On the other hand, the reflective electrodes 30 may be formed on each of the mesas M after formation of the mesas M, without being limited thereto. Alternatively, after second conductive type semiconductor layer 27 is formed, the reflective electrodes 30 may be formed on the second conductive type semiconductor layer 27 before formation of the mesas M. The reflective electrodes 30 cover most of an upper surface of the mesa M and have substantially the same shape as a shape of the mesa M in plan view.

The reflective electrodes 30 include a reflective layer 28 and may further include a barrier layer 29. The barrier layer 29 may cover an upper surface and side surfaces of the reflective layer 28. For example, a pattern of the reflective layer 28 is formed and then the barrier layer 29 is formed thereon, whereby the barrier layer 29 can be formed to cover the upper surface and the side surfaces of the reflective layer 28. For example, the reflective layer 28 may be formed by depositing Ag, Ag alloys, Ni/Ag, NiZn/Ag, or TiO/Ag, followed by patterning. The barrier layer 29 may be formed of Ni, Cr, Ti, Pt, Rd, Ru, W, Mo, TiW, or combinations thereof, and prevents diffusion or contamination of metallic materials in the reflective layer.

After the plural mesas M are formed, an edge of the first conductive type semiconductor layer 23 may also be etched. As a result, an upper surface of the substrate 21 may be exposed. A side surface of the first conductive type semiconductor layer 23 may also be slantly formed.

According to the present invention, the light emitting diode chip further includes a lower insulation layer 31 that covers the plurality of mesas M and the first conductive type semiconductor layer 23. The lower insulation layer 31 has openings formed in specific regions and allowing electrical connection to the first conductive type semiconductor layer 23 and the second conductive type semiconductor layer 27. For example, the lower insulation layer 31 may have openings that expose the first conductive type semiconductor layer 23, and openings that expose the reflective electrodes 30.

The openings may be placed between the mesas M and near an edge of the substrate 21, and may have an elongated shape extending along the mesas M. On the other hand, some openings are restrictively placed on the mesas to be biased towards the same ends of the mesas.

According to the present invention, the light emitting diode chip includes a current spreading layer 33 formed on the lower insulation layer 31. The current spreading layer 33 covers the plurality of mesas M and the first conductive type semiconductor layer 23. In addition, the current spreading layer 33 has openings, which are placed within upper areas of the mesas M and expose the reflective electrodes, respectively. The current spreading layer 33 may form ohmic contact with the first conductive type semiconductor layer 23 through the openings of the lower insulation layer 31. The current spreading layer 33 is insulated from the plural mesas M and the reflective electrodes 30 by the lower insulation layer 31.

The openings of the current spreading layer 33 have a larger area than the openings of the lower insulation layer 31 in order to prevent the current spreading layer 33 from contacting the reflective electrodes 30.

The current spreading layer 33 is formed over a substantially overall upper area of the substrate 21 excluding the openings. Accordingly, current can be easily dispersed through the current spreading layer 33. The current spreading layer 33 may include a highly reflective metal layer, such as an Al layer, and the highly reflective metal layer may be formed on a bonding layer, such as Ti, Cr, Ni or the like. Further, a protective layer having a monolayer or composite layer structure of Ni, Cr or Au may be formed on the highly reflective metal layer. The current spreading layer 33 may have a multilayer structure of, for example, Ti/Al/Ti/Ni/Au.

The light emitting diode chip according to the present invention includes an upper insulation layer 35 formed on the current spreading layer 33. The upper insulation layer 35 has openings which expose the current spreading layer 33, and openings which expose the reflective electrodes 30.

The upper insulation layer 35 may be formed of an oxide insulation layer, a nitride insulation layer, combinations thereof, or a polymer such as polyimide, Teflon, Parylene, and the like.

A first pad 37a and a second pad 37b are formed on the upper insulation layer 35. The first pad 37a is connected to the current spreading layer 33 through the opening of the upper insulation layer 35 and the second pad 37b is connected to the reflective electrodes 30 through the openings of the upper insulation layer 35. The first pad 37a and the second pad 37b may be used as pads for SMT or connection of bumps for mounting the light emitting diode on the circuit board, and the like.

The first and second pads 37a, 37b may be formed simultaneously by the same process, for example, a photolithography and etching process or a lift-off process. The first and second electrode pads 37a, 37b may include a bonding layer formed of, for example, Ti, Cr, Ni, and the like, and a highly conductive metal layer formed of Al, Cu, Ag, Au, and the like. The first and second pads 37a, 37b may be formed such that distal ends of the electrode pads are placed on the same plane, whereby the light emitting diode chip can be flip-chip bonded to a conductive pattern formed to the same thickness on the circuit board.

Then, the growth substrate 21 is divided into individual light emitting diode chip units, thereby providing finished light emitting diode chips. The substrate 21 may be removed from the light emitting diode chips before or after division into individual light emitting diode chip units.

As such, the light emitting diode chip according to the present invention directly mounted on the circuit board by flip-chip bonding can realize high efficiency and size reduction for a slim structure, as compared with a typical package type light emitting device.

Figure 3:
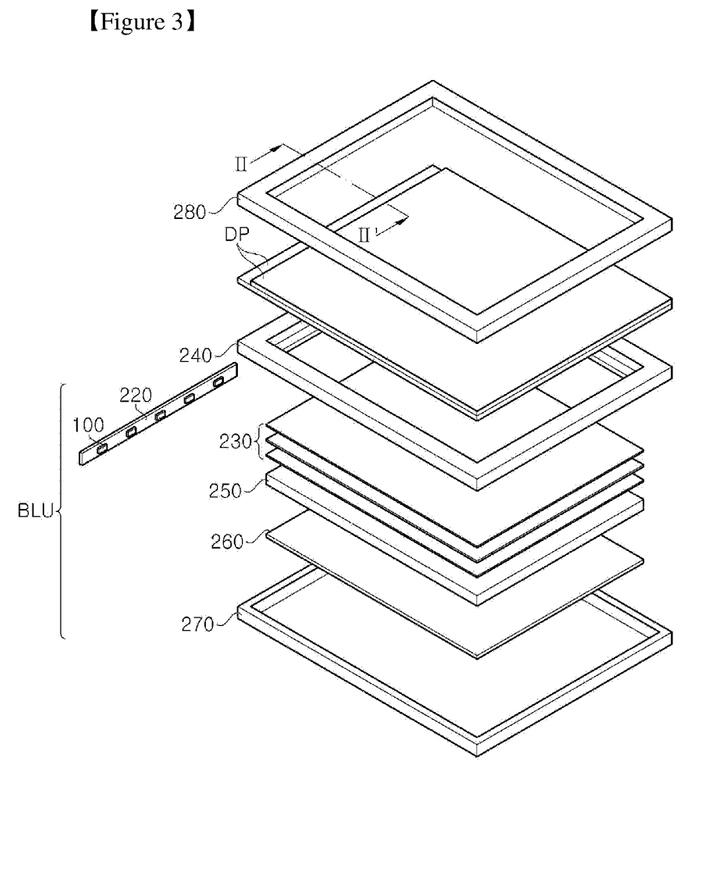
FIG. 3 is an exploded perspective view of a display device including a backlight unit according to one embodiment of the present invention.
Figure 4:
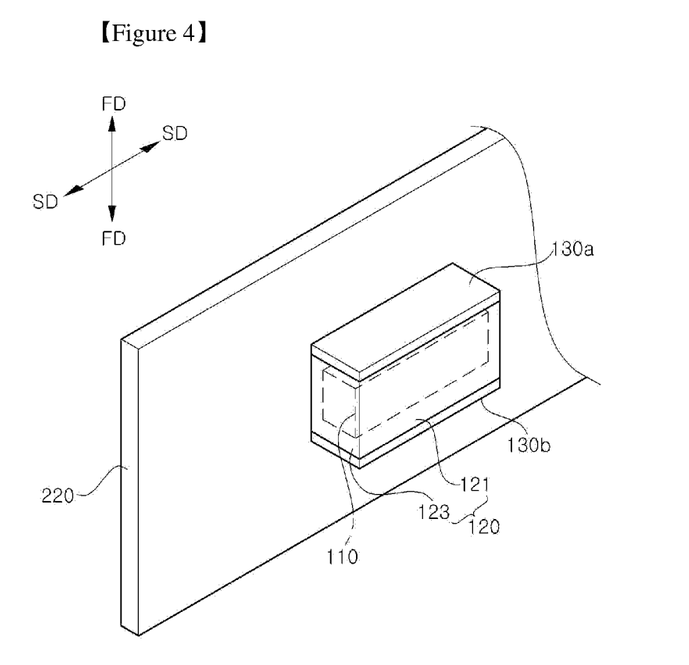
FIG. 4 is a perspective view of a light source module according to one embodiment of the present invention.

FIG. 3 is an exploded perspective view of a display device including an edge type backlight unit according to one embodiment of the present invention; FIG. 4 is a perspective view of a light source module according to one embodiment of the present invention; and FIG. 5 is a sectional view of the display device taken along line II-II' of FIG. 3.

Figure 5:
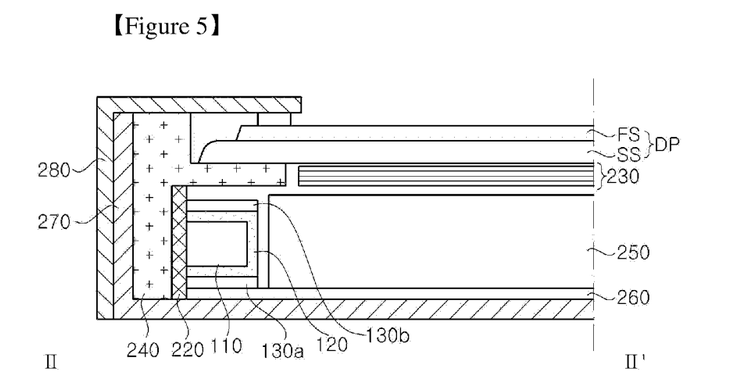
FIG. 5 is a sectional view of the display device taken along line II-II' of FIG. 3.

Referring to FIG. 3 to FIG. 5, a display device including an edge type backlight unit according to one embodiment of the invention includes a display panel DP on which an image will be displayed, a backlight unit BLU disposed at the rear side of the display panel DP and emitting light, a frame 240 supporting the display panel DP and receiving the backlight unit BLU, and a top cover 280 surrounding the display panel DP.

The display panel DP includes a color filter substrate FS and a thin film transistor substrate SS assembled to each other to face each other while maintaining a uniform cell gap. The display panel DP may further include a liquid crystal layer between the color filter substrate FS and the thin film transistor substrate SS according to the kind thereof.

Although not shown in detail, the thin film transistor substrate SS includes a plurality of gate lines and data lines, which cross each other to define pixels therebetween, and a thin film transistor placed in each of crossing regions therebetween and connected to a pixel electrode mounted in each of the pixels in one-to-one correspondence. The color filter substrate FS includes R, G and B color filters corresponding to the respective pixels, a black matrix disposed along the periphery of the substrate and shielding the gate lines, data lines and thin film transistors, and a common electrode covering all of these components. Here, the common electrode may be formed on the thin film transistor substrate SS.

The backlight unit BLU supplies light to the display panel DP, and includes a lower cover 270 partially open at an upper side thereof, a light source module disposed at one side within the lower cover 270 and a light guide plate 250 disposed parallel to the light source module to convert point light into surface light.

In addition, the backlight unit BLU according to the present invention includes optical sheets 230 placed on the light guide plate 250 to diffuse and collect light, and a reflective sheet 260 placed below the light guide plate 250 to reflect light travelling in a lower direction of the light guide plate 250 toward the display panel DP.

The light source module includes a circuit board 220 having a conductive pattern formed thereon, and a plurality of light emitting devices 100 mounted on one surface of the circuit board 220 and separated a predetermined distance from each other.

Each of the plural light emitting devices 100 includes a light emitting diode chip 110, a wavelength conversion layer 120, and first and second reflectors 130a, 130b.

The wavelength conversion layer 120 is configured to surround an upper surface and side surfaces of the light emitting diode chip 110. The wavelength conversion layer 120 may have a uniform thickness over the entirety thereof. Alternatively, the wavelength conversion layer 120 may include a first wavelength conversion layer covering both side surfaces of the light emitting diode chip 110 and a second wavelength conversion layer covering the upper surface of the light emitting diode chip 110, in which the second wavelength conversion layer has a greater thickness than the first wavelength conversion layer. The reason why the second wavelength conversion layer is formed to have a greater thickness than the first wavelength conversion layer is that the light emitting diode chip 110 emits a greater amount of light through the upper surface thereof than through the side surfaces thereof The first and second reflectors 130a, 130b are placed on opposite sides of the wavelength conversion layer 120. More specifically, the first and second reflectors 130a, 130b may be symmetrical to each other in a first direction FD. The first direction FD may be defined as a direction perpendicular to a longitudinal direction of the circuit board 220 on one surface of the circuit board 220. In addition, the first direction FD may be defined as a direction perpendicular to a longitudinal direction of an incident face of the light guide plate 250. A second direction SD is defined as a direction perpendicular to the first direction FD. That is, the second direction SD may correspond to the longitudinal direction of the circuit board 220. In addition, the second direction SD may correspond to the longitudinal direction of the incident face of the light guide plate 250. Here, the incident face of the light guide plate 250 may be defined as one side surface of the light guide plate 250 through which light emitted from the light emitting device 100 enters the light guide plate 250.

Each of the first and second reflectors 130a, 130b has one end facing the circuit board 220 and the other end facing the incident face of the light guide plate 250.

The first and second reflectors 130a, 130b covers the overall side surfaces of the wavelength conversion layer 120, which are symmetrical to each other in the first direction FD. Each of the first and second reflectors 130a, 130b may be formed by coating a reflective material on one surface of a resin, or may be composed of a resin containing a reflective material.

The first reflector 130a is placed parallel to an upper surface of the light guide plate 250.

The second reflector 130b is placed parallel to a lower surface of the light guide plate 250.

Although not shown in detail, the light emitting device 100 may include a convex-concave structure formed in a boundary region between each of the first and second reflectors 130a, 130b and the wavelength conversion layer 120 to change a reflection angle of light.

The wavelength conversion layer 120 includes first exit faces 132 exposed from the first and second reflectors 130a, 130b in the second direction SD corresponding to the longitudinal direction of the circuit board 220, and a second exit face 121 exposed from the first and second reflectors 130a, 130b so as to face the incident face of the light guide plate 250.

As such, the backlight unit BLU of the present invention can realize a slim structure by the highly efficient flip-chip type light emitting devices each having the first and second reflectors 130a, 130b in the first direction FD, as compared with a typical backlight unit.

In addition, the backlight unit BLU of the present invention can reduce light loss by the highly efficient flip-chip type light emitting devices each having the first and second reflectors 130a, 130b in the first direction FD, and can realize high efficiency through improvement in heat dissipation by a COB structure directly mounted on the circuit board 220.

Figure 6:
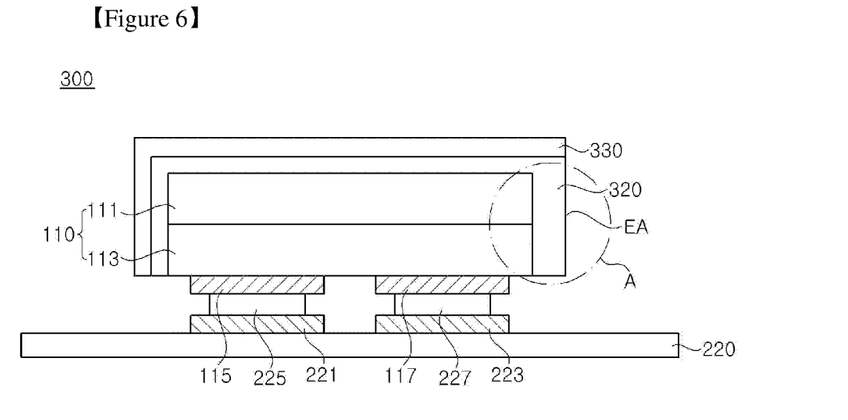
FIG. 6 is a sectional view of a light source module according to another embodiment of the present invention.
Figure 7:
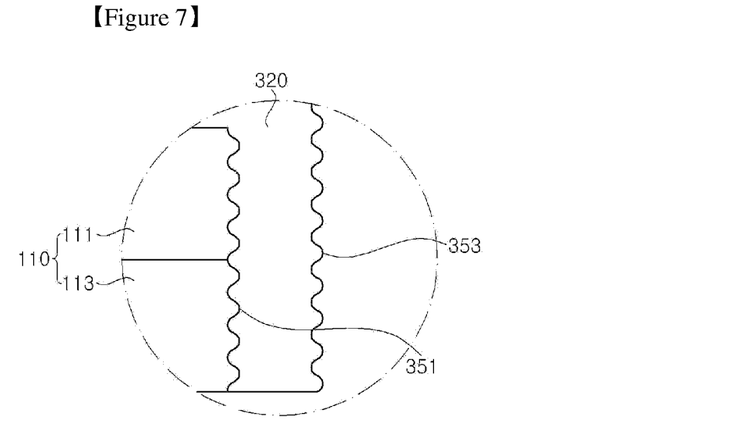
FIG. 7 is a detailed view of region A of FIG. 6.

FIG. 6 is a sectional view of a light source module according to another embodiment of the present invention and FIG. 7 is a detailed view of region A of FIG. 6.

Referring to FIG. 6 and FIG. 7, a light source module 300 according to this embodiment have the same features as those of the light emitting device 100 shown in FIG. 1 excluding a wavelength conversion layer 320, a reflector 330 and a circuit board 220. Thus, the same components of the light source module 300 will be denoted by the same reference numerals as those of the above embodiments and detailed descriptions thereof will be omitted.

The circuit board 220 includes substrate pads 221, 223 electrically connected to a light emitting diode chip 110 and bumpers 225, 227 respectively placed on the substrate pads 221, 223.

In the light source module 300, the light emitting diode chip 110 is directly mounted on the circuit board 220. The light emitting diode chip 110 is mounted on the circuit board to be electrically connected to the substrate pads 221, 223 on the circuit board 220 by flip-chip bonding without using a bonding wire. Here, the bumpers 225, 227 may be placed between the substrate pads 221, 223 and electrode pads 115, 117 exposed on a lower surface of the light emitting diode chip 110, respectively. In the light source module 300 according to the present invention, since the bonding wire is not used when bonding the light emitting diode chip 110 onto the circuit board, there is no need for a molding section for protection of the wire and for partial removal of the wavelength conversion layer 320 to expose a bonding pad. Accordingly, use of the flip-chip type light emitting diode chip 110 can prevent color deviation or bright spots and can simplify the process of fabricating the light emitting module, as compared with a light emitting diode chip using the bonding wire. Here, the light emitting diode chip 220 may be mounted on the circuit board by SMT as well as flip-chip bonding.

The wavelength conversion layer 320 covers the light emitting diode chip 110. As shown, the wavelength conversion layer 320 is formed to surround an upper surface and side surfaces of the light emitting diode chip 110. For example, a phosphor layer may be formed on the light emitting diode chip 110 to convert a wavelength of light emitted from the light emitting diode chip 110. The wavelength conversion layer 320 may be formed to a predetermined thickness on the light emitting diode chip 110 by coating to cover the upper surface and the side surfaces of the light emitting diode chip 110. The wavelength conversion layer 320 may have a uniform thickness over the entirety thereof. Alternatively, in the wavelength conversion layer 320, a region covering the upper surface of the light emitting diode chip 110 may have a different thickness than regions covering the side surfaces of the light emitting diode chip 110. Alternatively, the wavelength conversion layer 320 may have different thicknesses in a region covering an exit face EA and in the regions covering the upper surface and the side surfaces of the light emitting diode chip 110 excluding the exit face EA. Here, the exit face EA may face one side surface of the light emitting diode chip 110.

The reflector 330 covers the upper surface and the side surfaces of the wavelength conversion layer 320 excluding the exit face EA. The reflector 330 serves to reflect light, the wavelength of which has been converted by the wavelength conversion layer 320, towards the exit face EA. That is, the reflector 330 serves to guide light to exit through one side surface of the light source module 300.

The light source module 300 includes first and second convex-concave sections 351, 353 having a convex-concave structure to reduce total reflection depending upon an incident angle of light. The first and second convex-concave sections 351, 353 may be placed on regions corresponding to the exit face EA.

The first convex-concave section 351 may be formed on one side surface of the light emitting diode chip 110 corresponding to the exit face EA. Accordingly, the wavelength conversion layer 320 has an inner side surface that has a structure corresponding to the first convex-concave section 351.

The second convex-concave section 353 may be formed on one side surface of the wavelength conversion layer 320 corresponding to the exit face EA.

Although not particularly limited to a certain method, a method of fabricating the light source module 300 may include, for example, mounting the light emitting diode chip 110 on the circuit board 220 through flip-chip bonding, forming the wavelength conversion layer 320 on the light emitting diode chip 110 through deposition, forming the reflector 330 on the wavelength conversion layer 320 through deposition, and removing part of the reflector 330 corresponding to the exit face EA through fly cutting or etching.

The light source module 300 according to this embodiment guides light to be emitted through the exit face EA defined by one side surface of the reflector 330, whereby the light can be collected in a desired direction, thereby maximizing luminous efficiency.

Further, in the light source module 300 according to this embodiment, the light emitting diode chip 110 is a flip-chip type light emitting diode chip directly mounted on the circuit board 220 by flip-chip bonding, and can realize high efficiency and size reduction for a slim structure, as compared with a typical package type light emitting device.

Furthermore, the light source module 300 according to this embodiment is advantageous in terms of thickness reduction, as compared with a typical package type light source module.

Figure 8:
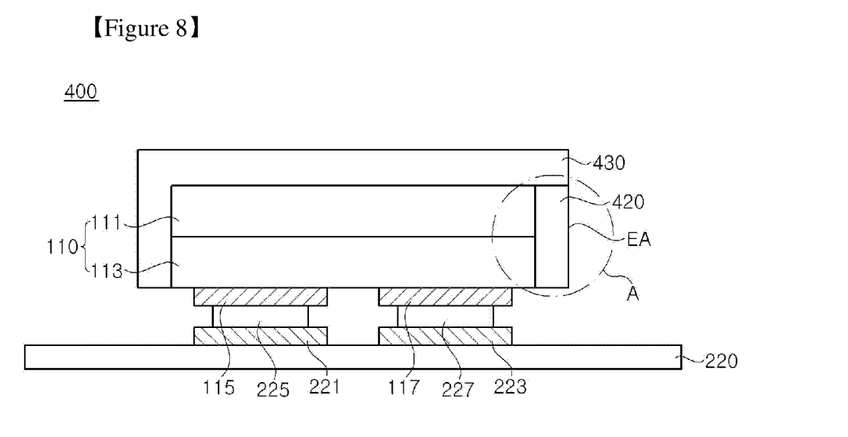
FIG. 8 is a sectional view of a light source module according to a further embodiment of the present invention.
Figure 9:
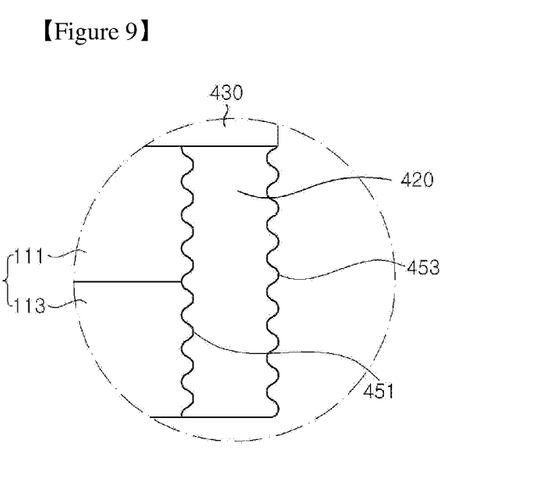
FIG. 9 is a detailed view of region A of FIG. 8.

FIG. 8 is a sectional view of a light source module according to a further embodiment of the present invention and FIG. 9 is a detailed view of region A of FIG. 8.

As shown in FIG. 8 and FIG. 9, a light source module 400 according to this embodiment has the same features as those of the light source module 300 of FIG. 6 and FIG. 7 excluding a wavelength conversion layer 420 and a reflector 430. Thus, the same components of the light source module 400 will be denoted by the same reference numerals as those of the above embodiments and detailed descriptions thereof will be omitted.

The light source module 400 includes a light emitting diode chip 110 directly mounted on the circuit board 220. The light emitting diode chip 110 is electrically connected to substrate pads 221, 223 on the circuit board 220 by flip-chip bonding without using a bonding wire. Here, bumpers 225, 227 may be placed between the substrate pads 221, 223 and the electrode pads 115, 117 exposed on a lower surface of the light emitting diode chip 110, respectively. In the light source module 400 according to the present invention, since the bonding wire is not used when bonding the light emitting diode chip onto the circuit board, there is no need for a molding section for protection of the wire and for partial removal of the wavelength conversion layer 420 to expose a bonding pad. Accordingly, the use of the flip-chip type light emitting diode chip 110 can prevent color deviation or brightness spots and can simplify the process of fabricating the light emitting module, as compared with a light emitting diode chip using the bonding wire.

The wavelength conversion layer 420 is placed on one side surface of the light emitting diode chip 110. The wavelength conversion layer 420 is placed on the exit face EA of the light source module 400. The wavelength conversion layer 420 can convert a wavelength of light emitted from the light emitting diode chip 110. The wavelength conversion layer 420 is coated onto the light emitting diode chip 110 and has a constant thickness. Here, the exit face EA may correspond to one side surface of the light emitting diode chip 110.

The reflector 430 covers the light emitting diode chip 110. The reflector 430 may cover an upper surface and side surfaces of the light emitting diode chip 110, and may also cover an upper surface of the wavelength conversion layer 420. That is, the reflector 430 may directly contact the upper surface and side surfaces of the light emitting diode chip 110. The reflector 430 serves to reflect emitted from the light emitting diode chip 110 towards the wavelength conversion layer 420. That is, the reflector 430 serves to guide light to be collected on the exit face EA of the light source module 400.

The light source module 400 includes first and second convex-concave sections 451, 453 having a convex-concave structure to reduce total reflection depending upon an incident angle of light. The first and second convex-concave sections 451, 453 may be placed on regions corresponding to the exit face EA.

The first convex-concave section 451 may be formed on one side surface of the light emitting diode chip 110 corresponding to the exit face EA. Accordingly, the wavelength conversion layer 420 has an inner side surface that has a structure corresponding to the first convex-concave section 451.

The second convex-concave section 453 may be formed on one side surface of the wavelength conversion layer 420 corresponding to the exit face EA.

The light source module 400 according to this embodiment guides light to be emitted through the exit face EA defined by one side surface of the reflector 430, whereby the light can be collected in a desired direction, thereby maximizing luminous efficiency.

Further, in the light source module 400 according to this embodiment, the light emitting diode chip 110 is a flip-chip type light emitting diode chip directly mounted on the circuit board 220 by flip-chip bonding, and can realize high efficiency and size reduction for a slim structure, as compared with a typical package type light emitting device.

Furthermore, the light source module 400 according to this embodiment is advantageous in terms of thickness reduction, as compared with a typical package type light source module. Particularly, since the reflector 430 covers the light emitting diode chip 110 and the wavelength conversion layer 420 is placed on the exit face EA, the light source module 400 is advantageous in terms of thickness reduction.

Figure 10:
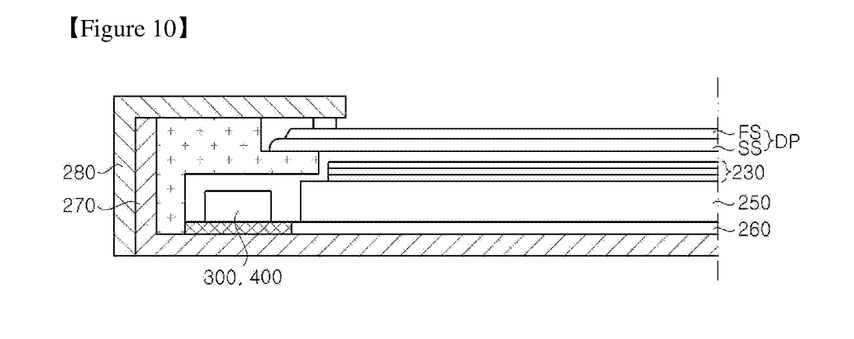
FIG. 10 is a sectional view of a display device including a light source module according to another embodiment of the present invention or a light source module according to a further embodiment of the present invention.

FIG. 10 is a sectional view of a display device including a light source module according to yet another embodiment of the present invention or a light source module according to still yet another embodiment of the present invention.

As shown in FIG. 10, the display device according to the present invention includes the light source module 300 or 400 as shown in FIG. 6 to FIG. 9, and has the same features as those of the display device shown in FIG. 5 excluding the light source module 300 or 400. Thus, the same components of the display device will be denoted by the same reference numerals as those of the above embodiment and detailed descriptions thereof will be omitted.

Each of the light source modules 300, 400 has a structure of a light emitting diode chip mounted on the circuit board by flip-chip bonding, and is configured to collect light on an exit face facing one side surface of the light guide plate 250 defined as an incident face of the light guide plate 250.

The circuit board is disposed parallel to a reflective sheet 260. That is, the circuit board may be placed on an inner surface of a lower cover 270.

The light source modules 300, 400 are a lateral light emitting type of a flip-chip structure and can maximize size reduction of the backlight unit to provide a slim structure.

In addition, the backlight unit according to the present invention employs the light source module 300 or 400, which is a lateral light emitting type of the flip-chip structure, and thus can reduce manufacturing costs by omitting a housing or a reflection member for reflecting light towards the light guide plate 250.

While various embodiments of the present invention have been described, the present invention is not limited to a particular embodiment. In addition, the components described in the specific embodiment may be used for other embodiments in the same or similar ways, without departing from the spirit and the scope of the present invention.

What is claimed is:

1. A backlight unit comprising:
a light guide plate; and
a first light source and a second light source adjacent to the light guide plate, each of the light sources comprising:
   a light emitting diode chip comprising a growth substrate and a semiconductor stack disposed on the growth substrate;
   a wavelength conversion layer directly disposed on the light emitting diode chip and extending to cover a side surface of the semiconductor stack of the light emitting diode chip;
   a plurality of reflectors disposed on at least two opposing side surfaces of the light emitting diode chip; and
   electrode pads disposed on a lower surface of the light emitting diode chip, the electrode pads not overlapping the reflectors,
wherein at least a portion of the wavelength conversion layer of the first light source facing the second light source is exposed by the reflectors, and
wherein an upper surface of at least one of the reflectors is flush with an upper surface of the wavelength conversion layer.

2. The backlight unit of claim 1, wherein the first and second light sources face each other through a surface on which the reflectors are not disposed, respectively.

3. The backlight unit of claim 1, wherein the reflectors comprise a first reflector and a second reflector, the first and second reflectors disposed on a substantially same plane as top and bottom surfaces of the light guide plate, respectively.

4. The backlight unit of claim 1, wherein the first and second light sources are disposed along a longitudinal direction of the growth substrate with a first interval therebetween.

5. The backlight unit of claim 4, wherein:
the wavelength conversion layer has a first surface facing a light entering surface of the light guide plate, and second side surfaces opposing each other; and
the first surface and the second side surfaces are exposed by the reflectors.

6. The backlight unit of claim 1, wherein:
the wavelength conversion layer includes a first region disposed on an upper surface of the light emitting diode chip, and a second region disposed on side surfaces of the light emitting diode chip; and
the first region and the second region have the same thickness.

7. The backlight unit of claim 1, wherein:
the wavelength conversion layer includes a first region disposed on an upper surface of the light emitting diode chip, and a second region disposed on side surfaces of the light emitting diode chip; and
the first region has a greater thickness than the second region.

8. The backlight unit of claim 1, wherein one end of the reflector faces the light guide plate and the other end thereof faces the growth substrate.

9. The backlight unit of claim 1, wherein a surface of the wavelength conversion layer interfacing the reflector has a convex-concave pattern.

10. The backlight unit of claim 1, wherein the reflector comprises at least one of a resin coated with a reflective layer and a resin including a reflective material.

11. The backlight unit of claim 1, wherein:
each of the semiconductor stacks comprises:
   a growth substrate;
   a first conductive type semiconductor layer formed on the growth substrate;
   a mesa formed on the first conductive type semiconductor layer and including an active layer and a second conductive type semiconductor layer;
   an electrode formed on the mesa;
   a current spreading layer on the mesa and the first conductive type semiconductor layer; and
   a lower insulation layer formed between the mesa and the current spreading layer and insulating the current spreading layer form the mesa;
   an upper insulation layer formed on the current spreading layer; and
   a first pad and a second pad formed on the upper insulation layer;

the first pad is electrically connect to the current spreading layer; and the second pad is electrically connect to the electrode.

12. A backlight unit comprising:
a light guide plate having a substantially flat shape; and
at least one light source disposed adjacent to the light guide plate, the light source comprising:
a light emitting diode chip comprising a plurality of semiconductor stacks;
a wavelength conversion layer directly disposed on the light emitting diode chip and extending to cover a side surface of each of the semiconductor stacks, respectively;
a reflective unit disposed on at least one side surfaces of the wavelength conversion layer, and having an upper surface flush with an upper surface of the wavelength conversion layer; and
electrode pads disposed on a lower surface of the light emitting diode chip, the electrode pads not overlapping the reflective unit,
wherein each of the semiconductor stacks comprises:
a growth substrate;
a first conductive type semiconductor layer formed on the growth substrate;
a mesa formed on the first conductive type semiconductor layer and including an active layer and a second conductive type semiconductor layer;
an electrode formed on the mesa;
a current spreading layer on the mesa and the first conductive type semiconductor layer; and
a lower insulation layer formed between the mesa and the current spreading layer and insulting the current spreading layer form the mesa;
an upper insulation layer formed on the current spreading layer; and
a first pad and a second pad formed on the upper insulation layer;

wherein the first pad is electrically connect to the current spreading layer, and wherein the second pad is electrically connect to the electrode.

13. The backlight unit of claim 11, wherein the reflective unit comprises:
a first reflector disposed on a first surface of the light source, the first surface being disposed on a substantially the same plane as an upper surface of the light guide plate; and
a second reflector disposed on a second surface of the light source, the second surface being disposed on a substantially the same plane as a bottom surface of the light guide plate.

14. The backlight unit of claim 12, further comprising a printed circuit board (PCB),
wherein:
the light source is provided in plural on the PCB; and
the reflective unit of each light source covers each side surface of the wavelength conversion layer that contacts the PCB and is substantially parallel to a longitudinal direction of the PCB.

15. The backlight unit of claim 12, wherein the first and second reflectors are not disposed on a surface of the light source that faces an adjacent light source.

16. The backlight unit of claim 11, wherein a surface of the wavelength conversion layer interfacing the reflective unit has a convex-concave pattern.

17. The backlight unit of claim 14, wherein the reflective unit comprises at least one of a resin coated with a reflective layer and a resin including a reflective material.

18. The backlight unit of claim 11, wherein a lower surface of the reflective unit is flush with a lower surface of the wavelength conversion layer.

* * * * *